(12) United States Patent
Chuang et al.

(10) Patent No.: US 9,865,645 B2
(45) Date of Patent: Jan. 9, 2018

(54) INTERCONNECT STRUCTURE FOR STACKED DEVICE AND METHOD

(71) Applicant: Taiwan Semiconductor Manufacturing Company, Ltd., Hsin-Chu (TW)

(72) Inventors: Chun-Chieh Chuang, Tainan (TW); Dun-Nian Yaung, Taipei (TW); Jen-Cheng Liu, Hsin-Chu (TW); Feng-Chi Hung, Chu-Bei (TW); Tzu-Hsuan Hsu, Kaohsiung (TW); Shu-Ting Tsai, Kaohsiun (TW); Min-Feng Kao, Chiayi (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/167,390

(22) Filed: May 27, 2016

(65) Prior Publication Data
US 2016/0276383 A1 Sep. 22, 2016

Related U.S. Application Data

(62) Division of application No. 13/898,641, filed on May 21, 2013, now Pat. No. 9,356,066.
(Continued)

(51) Int. Cl.
*H01L 21/76* (2006.01)
*H01L 21/00* (2006.01)
(Continued)

(52) U.S. Cl.
CPC ........ *H01L 27/1469* (2013.01); *H01L 21/768* (2013.01); *H01L 21/76898* (2013.01);
(Continued)

(58) Field of Classification Search
CPC ....... H01L 21/00; H01L 21/28; H01L 21/768; H01L 21/76; H01L 21/76898
(Continued)

(56) References Cited

U.S. PATENT DOCUMENTS 7,855,455 B2 * 12/2010 Purushothaman .. H01L 21/6835
257/750
2002/0074670 A1 6/2002 Suga et al.
(Continued)

*Primary Examiner* — Chuong A Luu
(74) *Attorney, Agent, or Firm* — Haynes and Boone, LLP

(57) ABSTRACT

A stacked integrated circuit (IC) device and a method are disclosed. The stacked IC device includes a first semiconductor element and a second semiconductor element bonded on the first semiconductor element. The first semiconductor element includes a first substrate, a common conductive feature in the first substrate, a first inter-level dielectric (ILD) layer, a first interconnection feature and a conductive plug connecting the first interconnection feature to the common conductive feature. The second semiconductor element includes a second substrate, a second ILD layers over the second substrate and a second interconnection feature in second ILD layers. The device also includes a conductive deep plug connecting to the common conductive feature in the first semiconductor element and the second interconnection feature. The conductive deep plug is separated with the conductive plug by the first ILD layer.

20 Claims, 9 Drawing Sheets

Related U.S. Application Data

(60) Provisional application No. 61/794,847, filed on Mar. 15, 2013.

(51) Int. Cl.
*H01L 27/146* (2006.01)
*H01L 21/768* (2006.01)
*H01L 23/48* (2006.01)

(52) U.S. Cl.
CPC ...... *H01L 23/481* (2013.01); *H01L 27/14634* (2013.01); *H01L 27/14636* (2013.01); *H01L 2924/0002* (2013.01)

(58) Field of Classification Search
USPC .......................................................... 438/67
See application file for complete search history.

(56) References Cited

U.S. PATENT DOCUMENTS

| | | |
|---|---|---|
| 2006/0292744 A1 | 12/2006 | Enquist et al. |
| 2012/0161275 A1 | 6/2012 | Gambino et al. |
| 2012/0256311 A1 | 10/2012 | Takeda et al. |
| 2012/0256319 A1* | 10/2012 | Mitsuhashi ....... H01L 27/14634 257/774 |
| 2013/0134576 A1* | 5/2013 | Hayashi ............ H01L 21/02697 257/734 |
| 2013/0175673 A1 | 7/2013 | Jin et al. |
| 2013/0264688 A1* | 10/2013 | Qian ................. H01L 21/76898 257/622 |
| 2014/0264682 A1 | 9/2014 | Chuang et al. |
| 2014/0264947 A1* | 9/2014 | Lin ....................... H01L 21/768 257/777 |

\* cited by examiner

INTERCONNECT STRUCTURE FOR STACKED DEVICE AND METHOD

The present application is a divisional application of U.S. application Ser. No. 13/898,641 filed on May 21, 2013 now U.S. Pat. No. 9,356,066, which claims the benefit of U.S. Ser. No. 61/794,847 filed Mar. 15, 2013, each of which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor technologies further advance, a stacked IC device has emerged as an effective alternative to further reduce the physical size of a semiconductor device. In a stacked IC device, active circuits such as logic, memory, processor circuits and the like are fabricated on different semiconductor wafers. Two or more semiconductor wafers may be installed on top of one another to further reduce the form factor of the IC device. For example, two semiconductor wafers may be bonded together through suitable bonding techniques. One advantageous feature of a stacked IC device is that a higher density can be achieved. Although existing stacked semiconductor devices and methods of fabricating stacked IC devices have been generally adequate for their intended purposes, they have not been entirely satisfactory in all respects. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
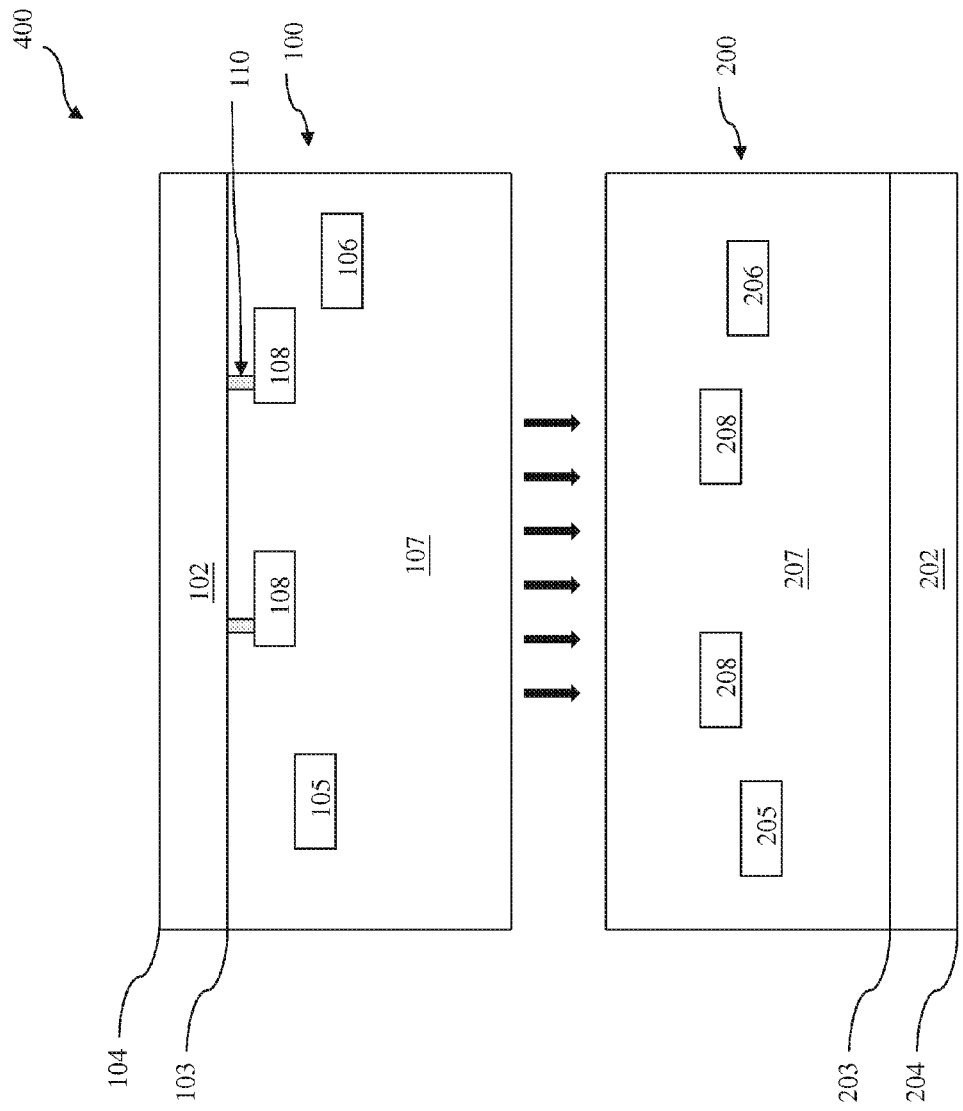
FIG. 1 is a cross-sectional view of a stacked integrated circuit (IC) device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of a stacked IC device 400 prior to a bonding process, according to various aspects of the present disclosure. FIG. 1 has been simplified for the sake of clarity to better illustrate the inventive concepts of the present disclosure. The stacked IC device 400 includes a first semiconductor wafer 100 stacked on top of a second semiconductor wafer 200. For example, the first semiconductor wafer 100 includes an image sensor, such as a backside illuminated (BSI) image sensor, a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor wafer 100 may include a transistor to generate a signal related to the intensity or brightness of light that impinges on the photo active region. The second semiconductor wafer 200 is an application-specific integrated circuit (ASIC) wafer.

As shown in FIG. 1, the first semiconductor wafer 100 (shown in an upside down position) includes a substrate 102 having a first surface 103 and a second surface 104. In some embodiments, the substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. In the depicted embodiment, the substrate 102 is doped with a p-type dopant. Suitable p-type dopants include boron, gallium, indium, other suitable p-type dopants, and/or combinations thereof. The substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

In various embodiments, the substrate 102 may take a form of a planar substrate, a fin, a nanowire, and/or other forms known to one of skill in the art.

The first semiconductor wafer 100 may include various passive and active microelectronic components. These components may include a primary component 105, such as an image sensor element and a peripheral circuit element 106, such as one or more field effect transistor. Other examples include P-channel field effect transistors (PFETs), N-channel FETs (NFETs), metal-oxide semiconductor field effect transistors (MOSFETs), CMOS transistors, FinFETs, high voltage transistors, high frequency transistors, bipolar junction transistors, resistors, capacitors, diodes, fuses, other suitable devices, and/or combinations thereof. In some embodiments, the peripheral circuit element 106 is operable to interface with or control the image sensor element 105. Although, in further embodiments, the peripheral circuit element 106 has no functional relationship to the primary element 105 aside from being collocated on the same substrate 102.

The first semiconductor wafer 100 includes a first inter-level dielectric (ILD) layer 107 formed over the first surface 103 of the substrate 102 for isolation purpose. The first ILD layer 107 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming ILD layer include thermal oxidation, chemical vapor deposition (CVD), high-density plasma CVD (HDP-CVD), physical vapor deposition (PVD), atomic layer deposition (ALD), spin-on deposition, and/or other suitable deposition processes. The first ILD layer 107 may include multiple layers made by different dielectric materials.

The first semiconductor wafer 100 includes first interconnection features 108 formed on the substrate 102 and configured to properly connect various doped regions in the substrate 102, resulting in a functional designed circuit. For example, the first interconnection features 108 include multi-layer interconnect (MLI) having horizontal metal lines formed on multiple metal layers and contact/via features to vertically connect metal lines of different metal layers or metal line lines to the substrate 102. The first interconnect features 108 are formed by an integrated process including deposition, lithography and etch.

In the present embodiment, a conductive plug 110 is formed over the substrate 102 such that one end of it connecting to the first interconnection feature 108 and another end of it connecting to the substrate 102. The conductive plug 110 can be made by conductive materials such as materials such as copper, aluminum, aluminum/silicon/copper alloy, titanium, titanium nitride, tungsten, polysilicon, metal silicide, and/or combinations thereof. The conductive plug 110 can be formed by a procedure including lithography, etch and deposition. As an example, prior to forming the first interconnection feature 108, a trench is formed in the first ILD layer 107 by lithography and etch processed. Then the trench is filled by a conductive material to form the conductive plug 110. And then the first interconnection feature 108 is formed on top of the conductive plug 110.

Additional features can be incorporated into the first semiconductor wafer 100 and some of the features described above can be replaced or eliminated for other embodiments of the first semiconductor wafer 100.

The second semiconductor wafer 200 can include similar or different elements, as compared to the first semiconductor wafer 100. For example, the second semiconductor wafer 200 includes a substrate 202 with surfaces 203 and 204, a primary element 205, a peripheral element 206, ILD layers 207, and interconnection features 208.

Figure 2:
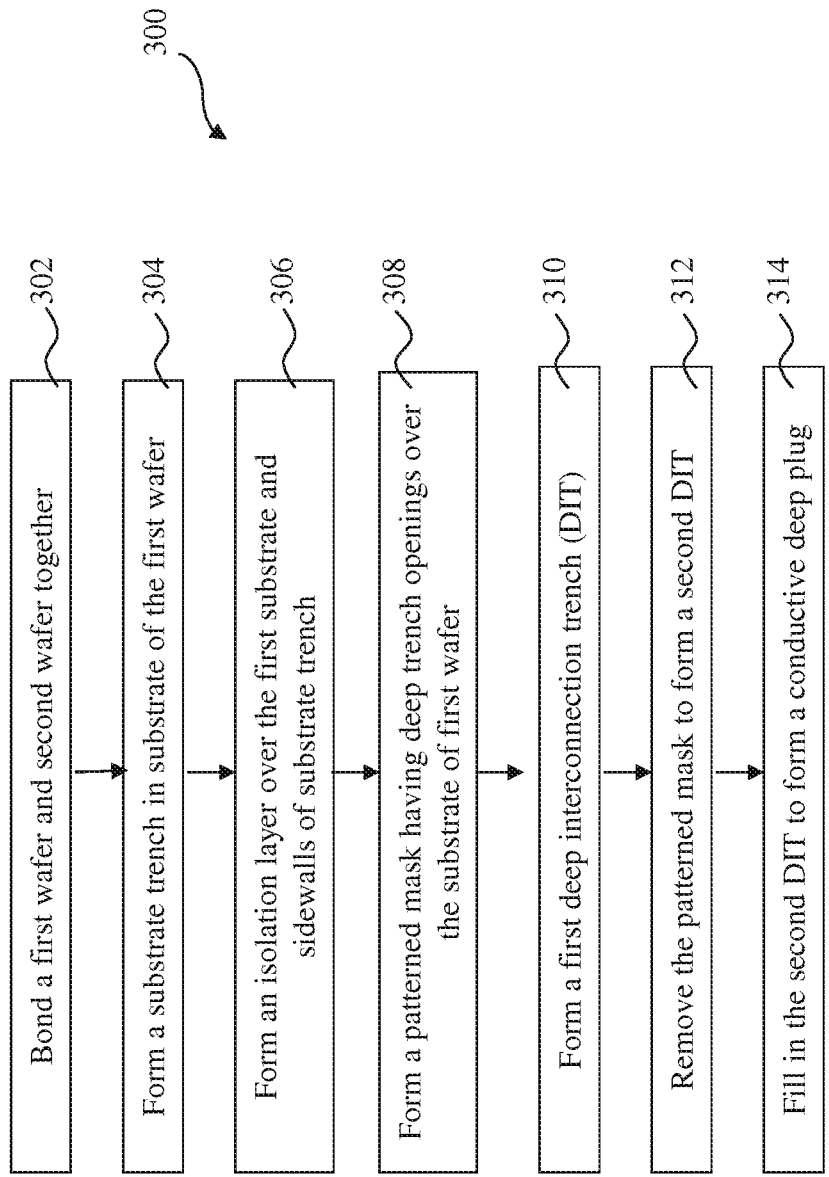
FIG. 2 is a flow chart of an example method for fabricating a stacked IC device according to various aspects of the present disclosure.

FIG. 2 is a flowchart of a method 300 for forming a stacked IC device according to aspects of the present disclosure. FIGS. 3-9 are cross-sectional views of an example stacked IC device 400 undergoing processes according to the method of FIG. 2. It is understood that additional steps can be provided before, during, and after the method, and some of the steps described can be replaced or eliminated for other embodiments of the method.

Figure 3:
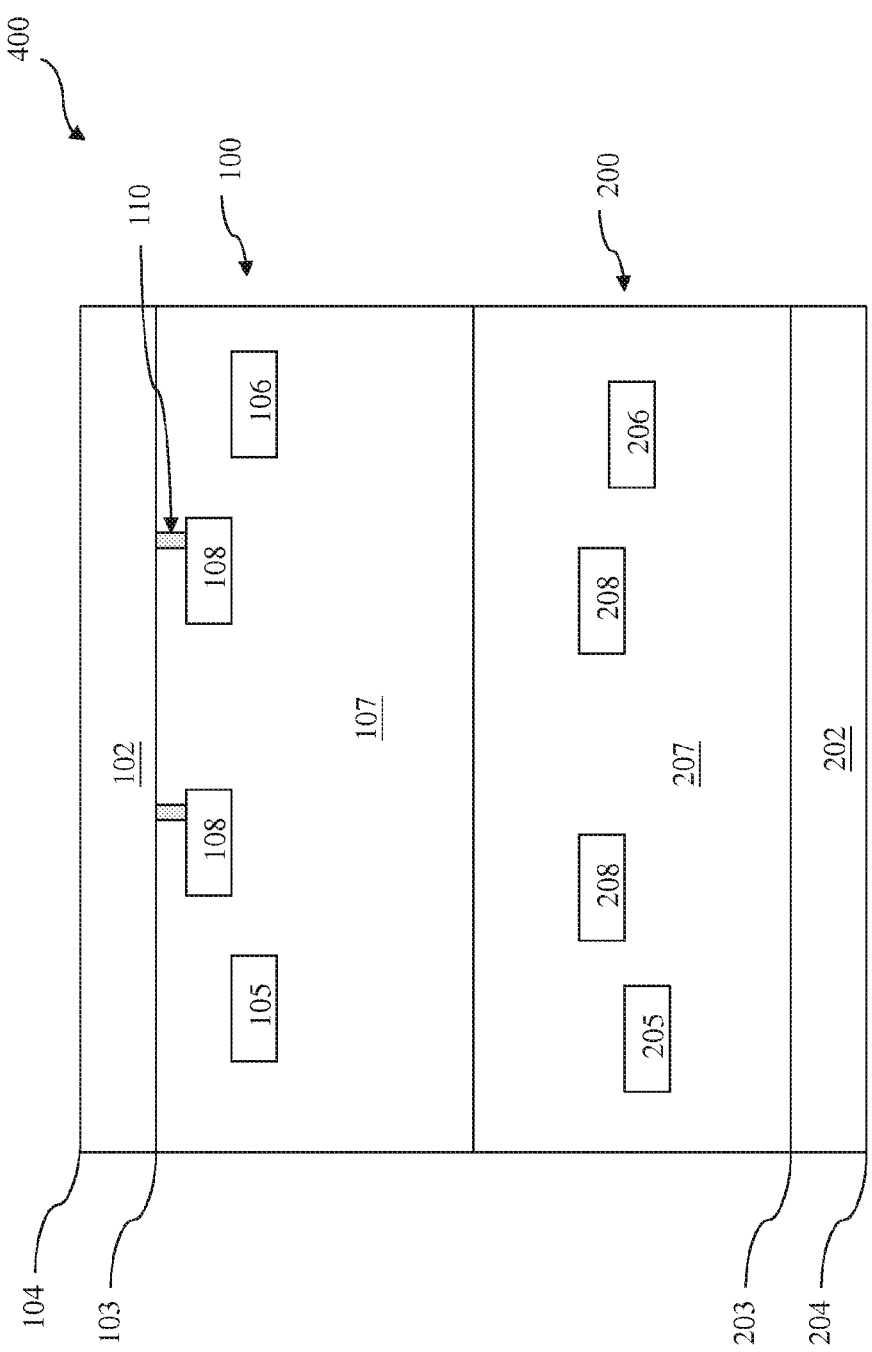
FIGS. 3-9 are cross-sectional views of an example stacked IC device at fabrication stages constructed according to the method of FIG. 2.

Referring to FIGS. 2 and 3, the method 300 begins at step 302 by bonding the first and second semiconductor wafers, 100 and 200, together through suitable bonding techniques such as direct bonding. In some embodiments, a plurality of bonding pads are formed in the first semiconductor wafer 100 and the second semiconductor wafer 200 respectively. Furthermore, the bonding pads located at the second semiconductor wafer 200 are aligned face-to-face with their corresponding bonding pads located at the first semiconductor wafer 100. In accordance with some embodiments, in a direct bonding process, the connection between the first and second semiconductor wafers 100 and 200 can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof. In some embodiment, the first and second semiconductor wafers, 100 and 200, are connected to each other through suitable three-dimensional structures. An adhesion layer may also be used.

Figure 4:
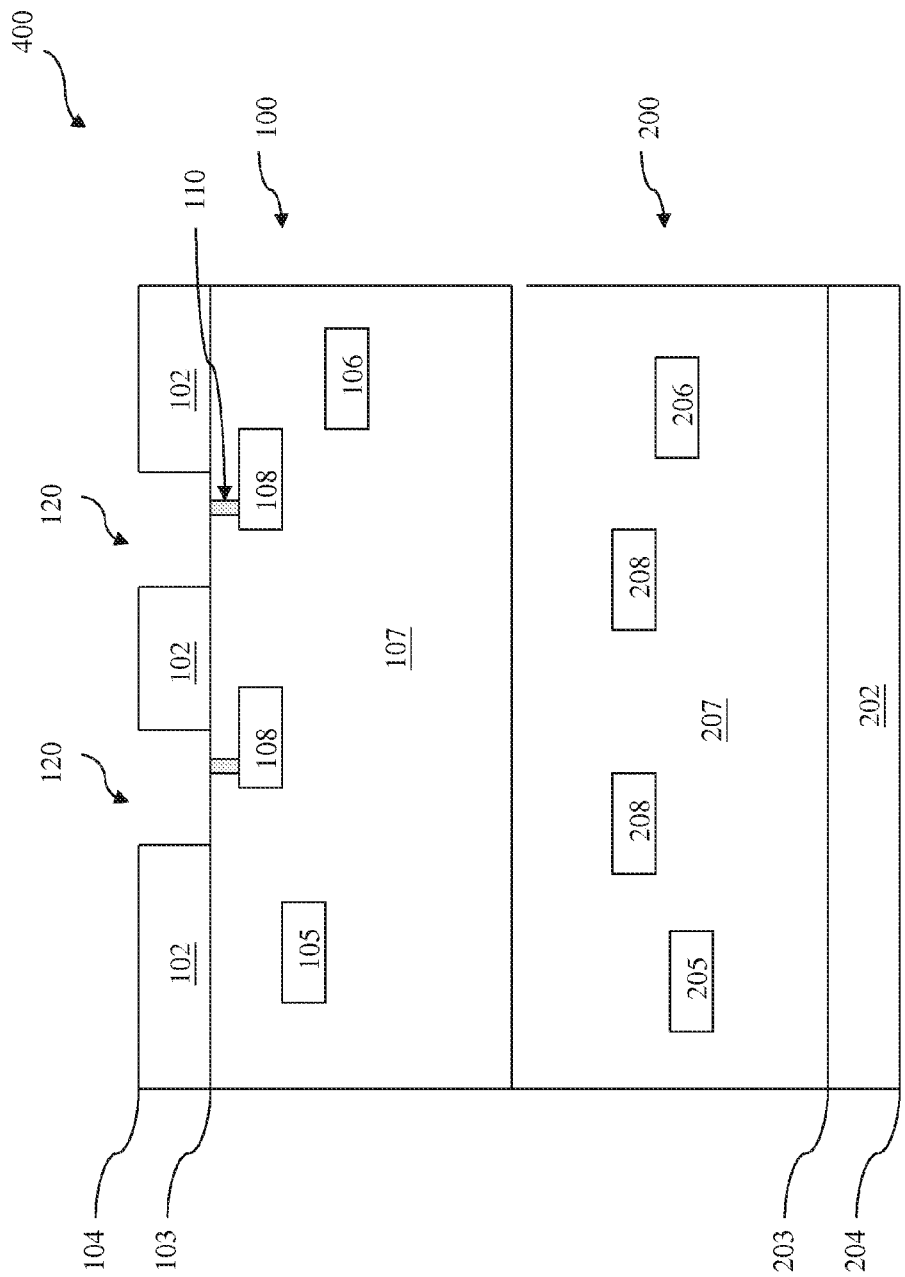

Referring to FIGS. 2 and 4, the method 300 proceeds to step 304 by forming a substrate trench 120 in the substrate 102. The substrate trench 120 is formed such that the first ILD layer 107 and at least a portion of the conductive plug 110 are exposed. The substrate trench 120 may be formed by lithography and etch processes. As an example, a patterned photoresist layer is formed over the substrate 102 by processes of spin-on coating, exposure and developing. Then substrate 102 is etched through the patterned photoresist. The etching process may include a dry etching process, a wet etching process, and/or combination thereof. The etching process may also include a selective wet etch or a selective dry etch. Example wet etching solutions include a tetramethylammonium hydroxide (TMAH), a HF/HNO3/CH3COOH solution, or other suitable solution. An example dry etching processes may include a biased plasma etching process that uses a chlorine-based chemistry. Other example dry etchant gasses include CF4, NF3, SF6, and He. In some embodiments, a selective etch is performed with adequate etch selectivity with respect to the first ILD layer 107 and the conductive plug 110. In that case the first ILD layer 107 serves as an etch-stop layer to improve etching process window.

Figure 5:
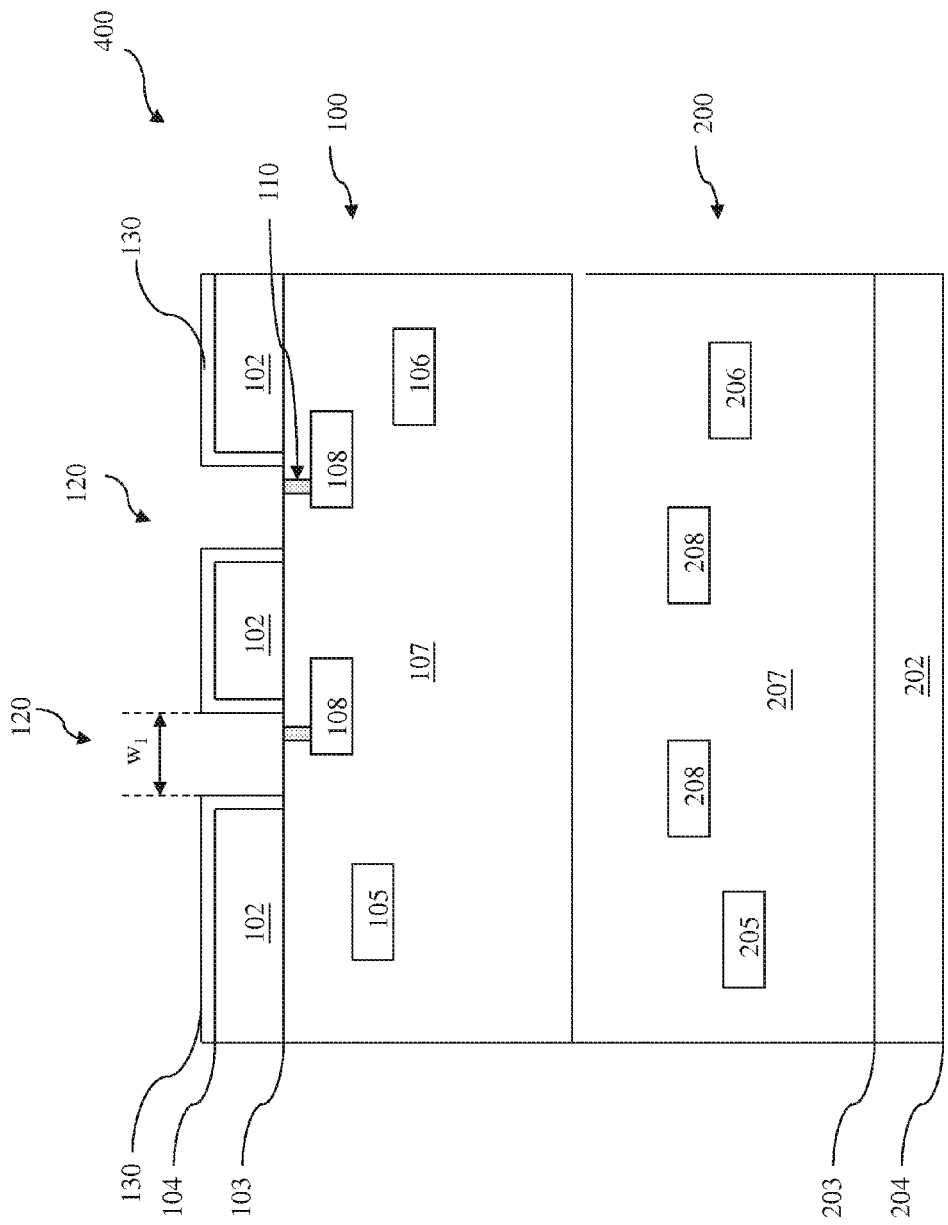

Referring to FIGS. 2 and 5, the method 300 proceeds to step 306 by forming an isolation layer 130 over the second surface 104 of the substrate 102 including sidewalls of the substrate trench 120. The isolation layer 130 provides an electric isolation sealing to the substrate 102. The isolation layer 130 may include dielectric materials such as silicon oxide, silicon nitride, silicon oxynitride, polyimide, or other suitable materials. The isolation layer 130 can be formed by CVD, PVD, ALD, and/or other suitable deposition processes. In one embodiment, another lithography and etch processes are performed to remove the isolation layer 130 at the bottom of the substrate trench 120. With the isolation layer 130 on the sidewalls, the substrate trench 120 has a first width $w_1$.

Figure 6:
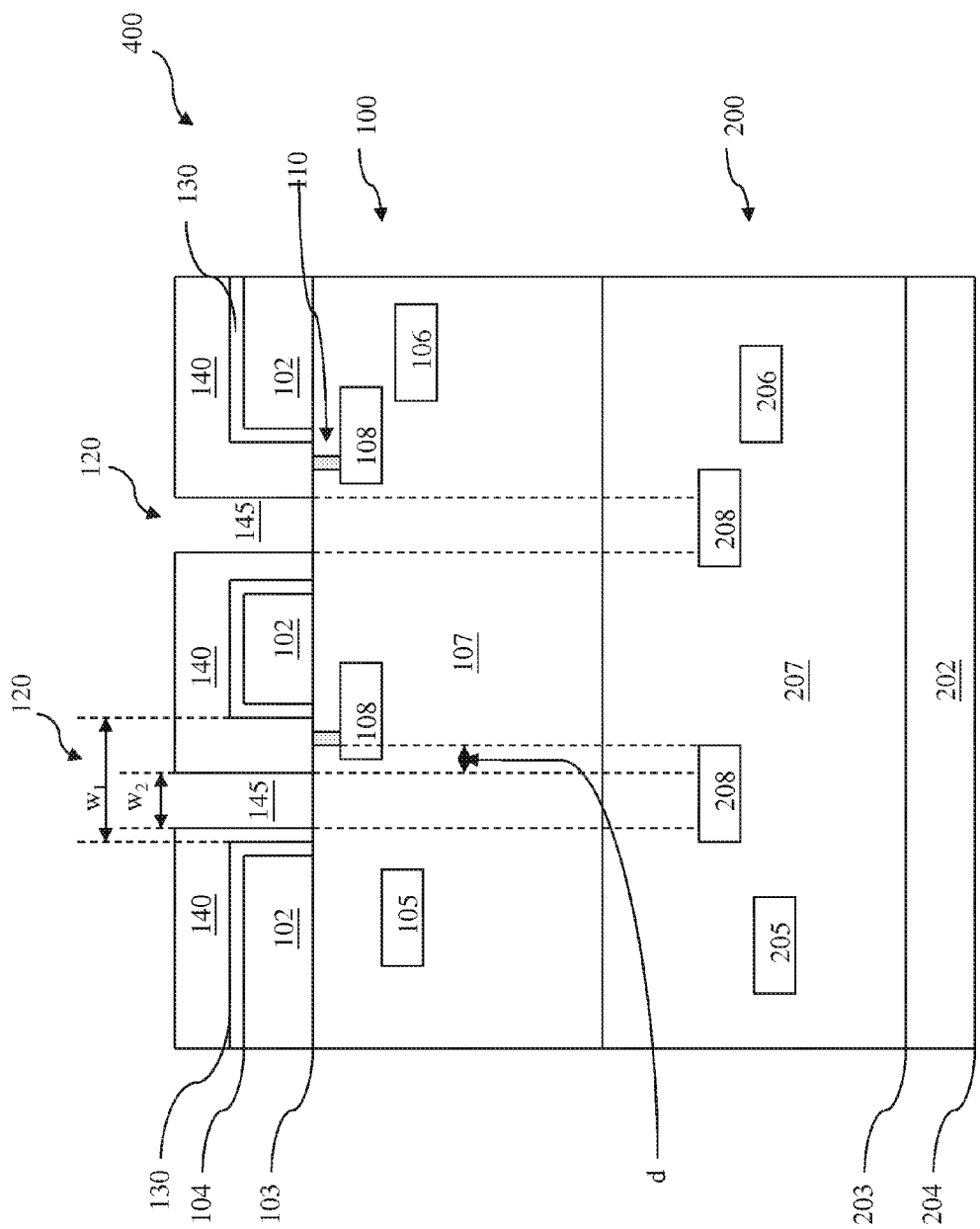

Referring to FIGS. 2 and 6, the method 300 proceeds to step 308 by forming a patterned mask 140 having deep-interconnect-trench (DIT) openings 145 with a second width $w_2$ and aligning to the substrate trench 120. The patterned mask 140 may be a photoresist layer. The patterned mask 140 is formed on top of the second surface 104 using suitable deposition and photo lithography techniques. In present embodiment, the DIT openings 145 align with the corresponding second interconnection feature 208 located in the second semiconductor wafer 200 and having a distance d away from the conductive plug 109 in the first ILD layer 107.

Figure 7:
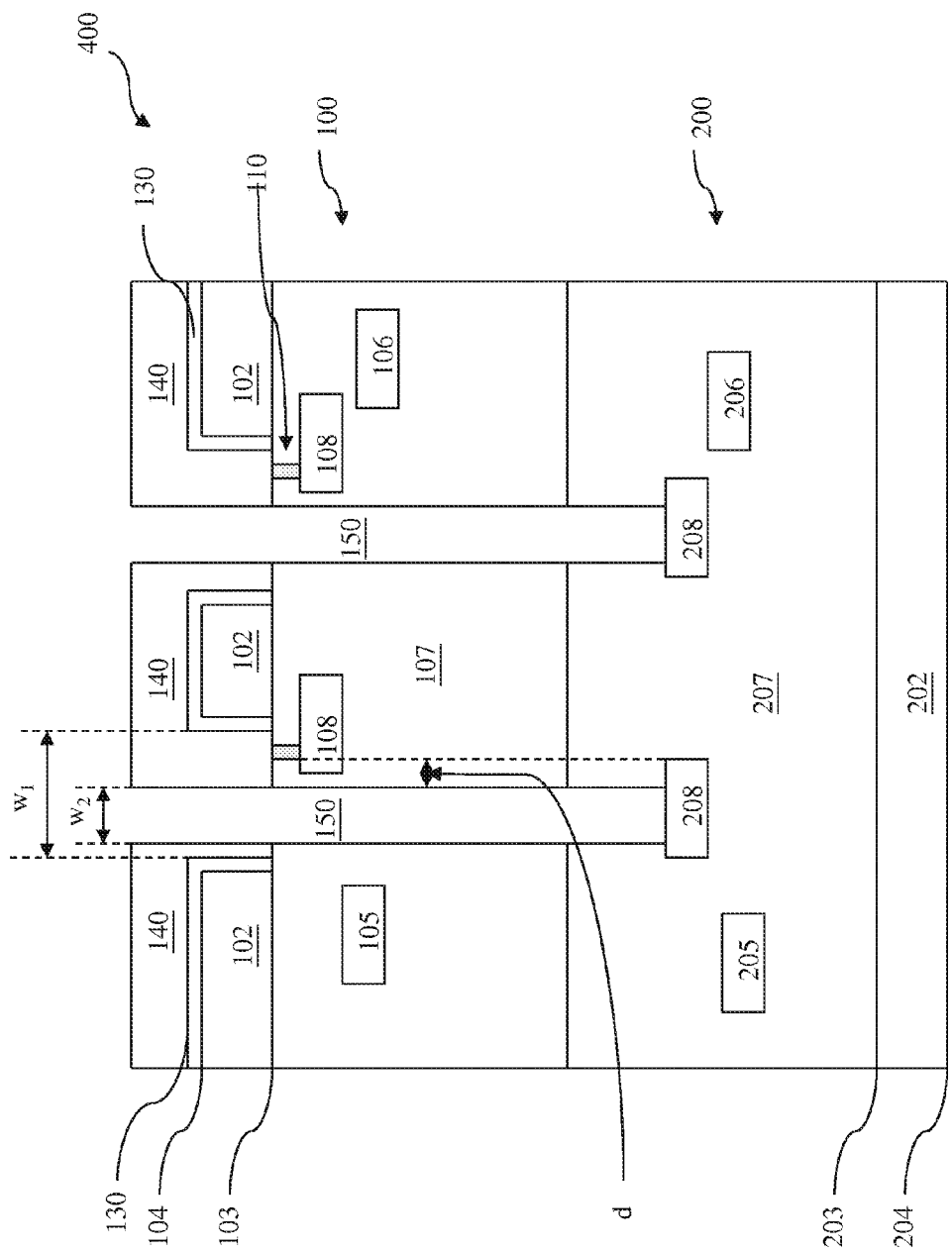

Referring to FIGS. 2 and 7, the method 300 proceeds to step 310 by forming first DITs 150 from the first semiconductor wafer 100 to the second interconnection feature 208 in the second semiconductor wafer 200. The first DITs 150 may be formed by etching the first ILD layer 107 in the first semiconductor wafer 100 and the second ILD layer 207 in the second semiconductor wafer 200 through the DIT openings 145. The DITs 150 are formed with a width which is substantially similar to the second width $w_2$ of the DIT openings 145. A suitable etching process includes a dry etch, an anisotropic wet etch, or any other suitable anisotropic etch.

Figure 8:
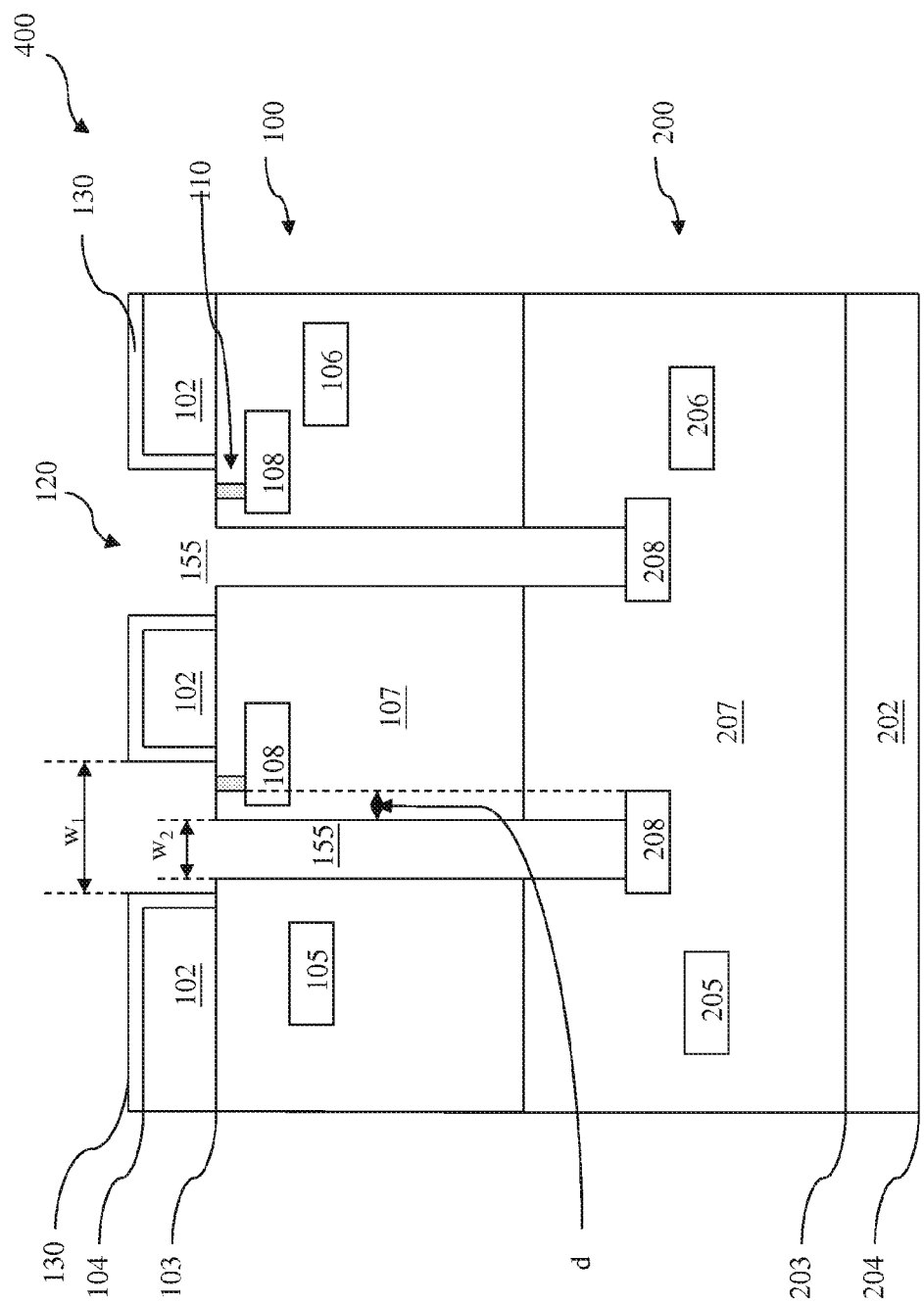

Referring to FIGS. 2 and 8, the method 300 proceeds to step 312 by removing the patterned mask 140 to form second DITs 155. As an example, the patterned photoresist mask 140 is removed by a process such as wet stripping or $O_2$ plasma ashing. In one embodiment, the second DITs 155 is formed to have the substrate trench 120 as an upper portion with the first width $w_1$ and the first DIT 150 as a lower portion with the second width $w_2$. Also, the conductive plug 110 is exposed in the upper portion of the second DITs 155.

Figure 9:
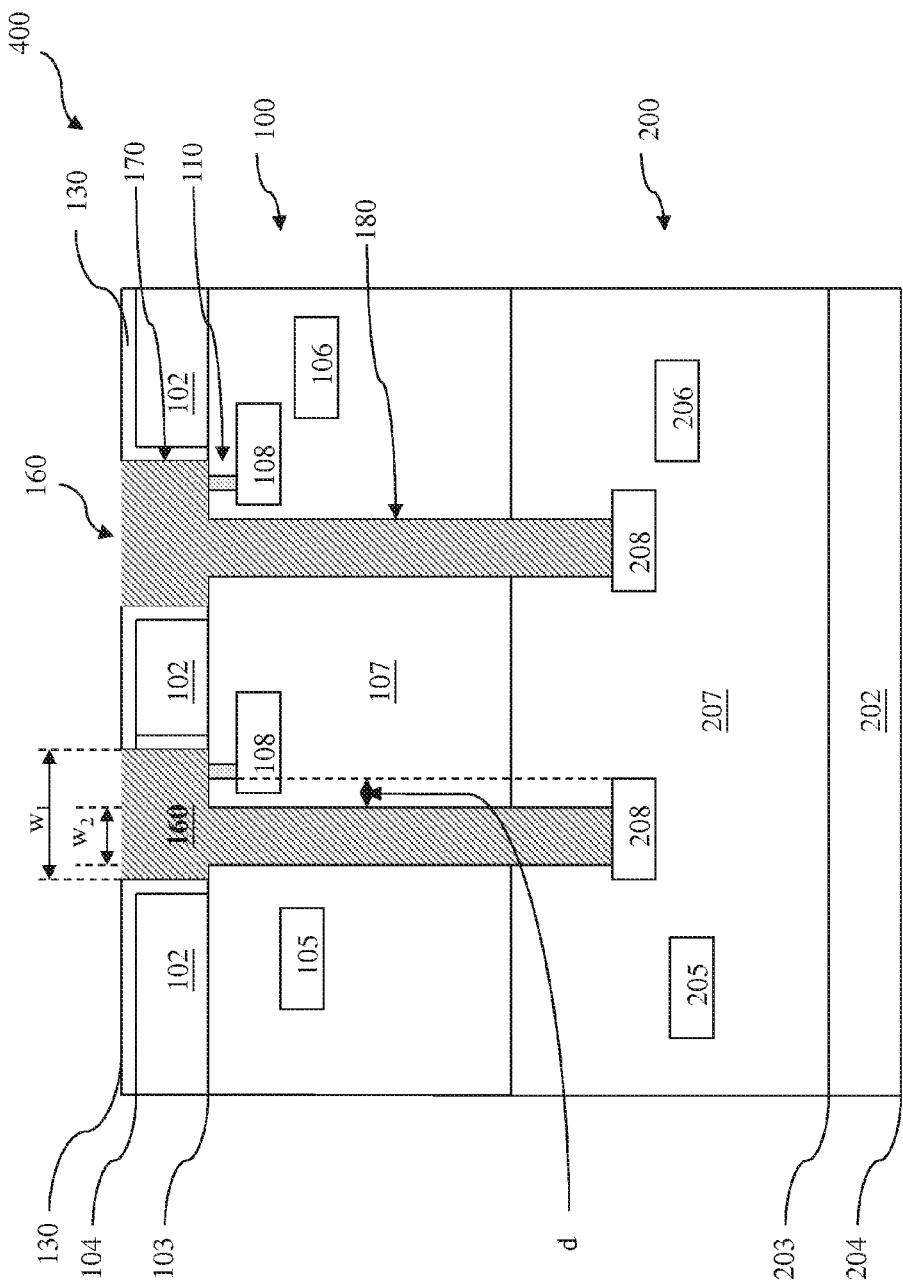

Referring to FIGS. 2 and 9, the method 300 proceeds to step 314 by filling in the second DITs 155 with conductive materials to form deep-interconnect-plugs (DIPs) 160. The DIPs 160 include highly-conductive, low-resistive metal, elemental metal, transition metal, or the like. For example, the DIPs 160 include copper, copper alloy, such as copper magnesium (CuMn), copper aluminum (CuAl) or copper silicon (CuSi), although other materials, such as tungsten, aluminum could alternatively be utilized. The DIPs 160 may be formed by any suitable method known in the art such as PVD, sputter, CVD, electroplating and/or the like. In one embodiment, the DIP 160s are further surrounded by a barrier layer to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN). The DIPs 160 is formed with an upper portion having the first width $w_1$ and a lower portion having the second width $w_2$. Additionally, a chemical mechanical polishing (CMP) may be applied to remove the conductive material for planarization effect if a desired topography is needed.

In the present embodiment, the upper portion of the DIP 160 connects with the substrate plug 110 (the first semiconductor wafer 100) and the low portion of the DIP 160 (the second semiconductor wafer 200) separately, the upper portion of the DIP 160 is referred to as a common conductive feature 170 for the first and second semiconductor wafers. The common conductive feature 170 has the first width $w_1$. The lower portion of the DIP 160 is referred to as a conductive deep-plug 180 and has the second width $w_2$. The $w_1$ is substantially larger than $w_2$. The conductive deep-plug 180 is separated to the substrate plug 110 with the distance d in the first ILD layer 107.

It should be noted that while FIG. 9 illustrates two semiconductor wafers stacked together, one skilled in the art will recognize that the stacked IC device shown in FIG. 9 is merely an example. There may be many alternatives, variations and modifications. For example, the stacked IC device may accommodate more than two wafers.

Based on the above, the present disclosure offers a stacked IC device employing an interconnection structure to provide electronic connection among two semiconductor wafers and fabrication. The interconnection structure is configured that both first and second semiconductor wafer connect individually to a common conductive feature in the first wafer. The first semiconductor wafer connects to the common conductive feature by a conductive plug formed in the first semiconductor wafer while the second semiconductor wafer connects to the common conductive feature by another conductive plug traveling through both of the first and a portion of second semiconductor wafers. The interconnection structure may provide electric interconnections between two semiconductor wafers with a shorter connection length, a denser interconnection feature layout and a reduced aspect ratio of the conductive plug.

The present disclosure provides many different embodiments of a stacked IC device. The stacked IC device includes a first wafer and a second wafer bonded on the first wafer. The first wafer includes a first substrate, a common conductive feature in the first substrate, a plurality of first interconnect components formed in first inter-level dielectric (ILD) layers over the first substrate, a first interconnection feature in first ILD layers and a conductive plug connecting the first interconnection feature to the common conductive feature. The second wafer includes a second substrate, a plurality of second interconnect components formed in second ILD layers over the second substrate and a second interconnection feature in second ILD layers. The device also includes a conductive deep plug connecting to the common conductive feature in the first wafer and the second interconnection feature in the second wafer. The conductive deep plug is separated with the conductive plug by the first ILD layer.

In another embodiment, a stacked IC device includes a first semiconductor wafer. The first semiconductor wafer includes a first interconnection feature and a conductive plug connecting to the first interconnection feature. The stacked IC device also includes a second semiconductor wafer bonded on the first semiconductor wafer. The second semiconductor wafer includes a second interconnection feature. The stacked IC device also includes a conductive deep plug coupled between the first and second interconnection feature. The conductive deep plug includes an upper portion connecting to the conductive plug in the first semiconductor wafer and a lower portion connective to the second interconnection feature in the second semiconductor wafer.

In yet another embodiment, a method for fabricating a stacked IC device includes providing a first semiconductor wafer. The first semiconductor wafer includes a first substrate, a first inter-level dielectric (ILD) layer over the first substrate, a first interconnection feature in the first ILD layer and a conducive plug in the first ILD layer. The conductive plug connects with the first substrate and the first interconnection feature. The method also includes bonding the first semiconductor wafer on a second semiconductor wafer. The second semiconductor wafer includes a second substrate, a second inter-level dielectric (ILD) layer over the second substrate and a second interconnection feature in the second ILD layers. The method also includes forming a substrate trench in the first substrate to expose the conductive plug and the first ILD layer, depositing a dielectric isolation layer over the first substrate and sidewalls of the substrate trench, then removing the dielectric isolation layer from a bottom of the substrate trench to expose the first ILD layer, forming a deep-interconnection-trench (DIT) pattern mask in the substrate trench, etching the first ILD and a portion of the second ILD through the DIT pattern mask to form a first DIT connecting to the second interconnection feature, removing the patterned mask to form a second DIT and filling the second DIT with conductive materials to form a conductive deep plug to couple the first and second semiconductor wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding a first semiconductor substrate having a first dielectric layer disposed thereover to a second semiconductor substrate having a second dielectric layer disposed thereover, wherein a first interconnection feature and a conductive plug are disposed within the first dielectric layer and a second interconnection feature is disposed within the second dielectric layer, wherein the conductive plug physically contacts the first interconnection feature and the first semiconductor substrate;
removing a portion of the first semiconductor substrate to form a first trench that extends through the first semiconductor substrate to expose a portion of the first dielectric layer;
forming a first material layer within the first trench;
removing the exposed portion of the first dielectric layer and a portion of the second dielectric layer to form a second trench extending to the second interconnection feature;
removing the first material layer from the first trench; and
forming a conductive material within the first trench and the second trench.

2. The method of claim 1, wherein the conductive plug is exposed within the first trench after the removal of the portion of the first semiconductor substrate to form the first trench that extends through the first semiconductor substrate to expose the portion of the first dielectric layer.

3. The method of claim 2, wherein forming the first material layer within the first trench includes forming the first material layer directly on the conductive plug such that the conductive plug is covered by the first material layer.

4. The method of claim 1, further comprising forming a second material layer within the first trench prior to forming the first material layer, and
wherein forming the first material layer within the first trench includes forming the first material layer over the second material layer.

5. The method of claim 4, wherein forming the conductive material within the first trench and the second trench includes forming the conductive material directly on the second material layer.

6. The method of claim 1, wherein the conductive material disposed within the first trench has a first width and the conductive material disposed within the second trench has a second width that is different than the first width.

7. The method of claim 1, wherein the conductive material disposed within the first trench forms a common conductive feature and the conductive material disposed within the second trench forms a conductive deep plug, and
wherein the common conductive feature is disposed directly over the first interconnection feature, the second interconnection feature, the conductive plug, and the conductive deep plug such that a bottom surface of the common conductive feature overlaps the first interconnection feature, the second interconnection feature, the conductive plug, and the conductive deep plug, the bottom surface of the common conductive feature facing the second semiconductor substrate.

8. The method of claim 1, wherein after removing the exposed portion of the first dielectric layer and the portion of the second dielectric layer to form the second trench extending to the second interconnection feature, the first material layer remains disposed within the first trench.

9. A method comprising:
bonding a first semiconductor substrate to a second semiconductor substrate, wherein a first dielectric layer and a second dielectric layer are disposed between the first and second semiconductor substrates, wherein a first interconnection feature and a conductive plug are disposed within the first dielectric layer and a second interconnection feature is disposed within the second dielectric layer, wherein the conductive plug physically contacts the first interconnection feature and the first semiconductor substrate;
patterning the first semiconductor substrate to form a first trench that extends through the first semiconductor substrate to expose the conductive plug;
forming a patterned mask layer within the first trench;
removing a portion of the first dielectric layer and a portion of the second dielectric layer through the first trench to form a second trench extending to the second interconnection feature;
removing the patterned mask layer from the first trench to expose the conductive plug; and
forming a conductive material within the first trench and the second trench such that conductive material physically contacts the conductive plug and the second interconnection feature.

10. The method of claim 9, wherein the first dielectric layer extends from the conductive plug to the conductive material disposed within the second trench.

11. The method of claim 9, further comprising forming an isolation layer within the first trench prior to forming the patterned mask layer within the first trench.

12. The method of claim 11, wherein the isolation layer is disposed within the first trench when forming the conductive material within the first trench and the second trench such that conductive material physically contacts the conductive plug and the second interconnection feature.

13. The method of claim 9, wherein the conductive material disposed within the first trench forms a common conductive feature and the conductive material disposed within the second trench forms a conductive deep plug, and
   wherein the common conductive feature is disposed directly over the first interconnection feature, the second interconnection feature, the conductive plug, and the conductive deep plug such that a bottom surface of the common conductive feature overlaps the first interconnection feature, the second interconnection feature, the conductive plug, and the conductive deep plug, the bottom surface of the common conductive feature facing the second semiconductor substrate.

14. The method of claim 9, wherein the conductive material disposed within the first trench has a first width and the conductive material disposed within the second trench has a second width that is less than the first width.

15. The method of claim 9, wherein after removing the portion of the first dielectric layer and the portion of the second dielectric layer through the first trench to form the second trench extending to the second interconnection feature, the patterned mask layer remains disposed within the first trench.

16. The method of claim 9, wherein forming the patterned mask layer within the first trench includes forming the patterned mask layer over the first semiconductor substrate, and
   wherein the patterned mask layer remains disposed over the first semiconductor substrate while removing the portion of the first dielectric layer and the portion of the second dielectric layer through the first trench to form the second trench extending to the second interconnection feature.

17. A method comprising:
   providing a first semiconductor element, the first semiconductor element including:
      a first substrate;
      a first inter-level dielectric (ILD) layer over the first substrate;
      a first interconnection feature in the first ILD layer; and
      a conductive plug in the first ILD layer, wherein the conductive plug connecting with the first substrate and the first interconnection feature, wherein the conductive plug physically contacts the first interconnection feature and the first substrate;
   bonding the first semiconductor element on a second semiconductor element, wherein the second semiconductor element comprises:
      a second substrate;
      a second inter-level dielectric (ILD) layer over the second substrate; and
      a second interconnection feature in the second ILD layers;
   forming a substrate trench in the first substrate to expose the conductive plug and the first ILD layer;
   depositing a dielectric isolation layer over the first substrate and sidewalls of the substrate trench;
   removing the dielectric isolation layer from a bottom of the substrate trench to expose the first ILD layer;
   forming a deep-interconnection-trench (DIT) pattern mask in the substrate trench;
   etching the first ILD layer and the second ILD layer through the DIT pattern mask to form a first DIT connecting to the second interconnection feature;
   removing the patterned mask to form a second DIT having the substrate trench as an upper portion and the first DIT as a lower portion; and
   filling the second DIT with conductive materials to form a conductive deep plug to couple the first and second semiconductor elements.

18. The method of claim 17, wherein the substrate trench is formed by processes of lithography and selective etching with adequate etch selectivity with respect to the first ILD layer.

19. The method of claim 18, wherein the first ILD layer serves as an etch-stop-layer.

20. The method of claim 17, wherein a width of the upper portion of the conductive deep plug is larger than a width of the lower portion.

* * * * *